United States Patent
Obara et al.

(10) Patent No.: US 11,581,201 B2
(45) Date of Patent: Feb. 14, 2023

(54) HEAT TREATMENT APPARATUS AND FILM DEPOSITION METHOD

(71) Applicant: Tokyo Electron Limited, Tokyo (JP)

(72) Inventors: Kazuteru Obara, Iwate (JP); Tatsuya Yamaguchi, Iwate (JP); Yasuaki Kikuchi, Iwate (JP); Ryuji Kusajima, Iwate (JP); Shinya Nasukawa, Iwate (JP); Kazuyuki Kikuchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 310 days.

(21) Appl. No.: 16/820,898

(22) Filed: Mar. 17, 2020

(65) Prior Publication Data

US 2020/0303222 A1 Sep. 24, 2020

(30) Foreign Application Priority Data

Mar. 20, 2019 (JP) .............................. JP2019-053842

(51) Int. Cl.

| | |
|---|---|
| H01L 21/67 | (2006.01) |
| C23C 16/455 | (2006.01) |
| H01L 21/324 | (2006.01) |
| H01L 21/677 | (2006.01) |
| C23C 16/34 | (2006.01) |

(52) U.S. Cl.
CPC ........ *H01L 21/67098* (2013.01); *C23C 16/34* (2013.01); *C23C 16/455* (2013.01); *H01L 21/324* (2013.01); *H01L 21/67248* (2013.01); *H01L 21/67769* (2013.01)

(58) Field of Classification Search
CPC ............. H01L 21/67098; H01L 21/324; H01L 21/67248; H01L 21/67769
See application file for complete search history.

(56) References Cited

U.S. PATENT DOCUMENTS

| | | | | |
|---|---|---|---|---|
| 2009/0035463 | A1* | 2/2009 | Dip ................... | H01L 21/67098 427/255.28 |
| 2013/0256293 | A1* | 10/2013 | Takenaga .......... | H01L 21/67248 219/413 |
| 2014/0342573 | A1* | 11/2014 | Hirose .............. | H01L 21/02109 438/761 |
| 2015/0380284 | A1* | 12/2015 | Yang ................. | H01L 21/67098 219/407 |

(Continued)

FOREIGN PATENT DOCUMENTS

| | | |
|---|---|---|
| JP | 2001-345314 A | 12/2001 |
| JP | 2006-66587 A | 3/2006 |

(Continued)

*Primary Examiner* — Nathan W Ha
(74) *Attorney, Agent, or Firm* — Venjuris, P.C.

(57) ABSTRACT

A heat treatment apparatus includes: a processing container configured to accommodate and process a plurality of substrates in multiple tiers under a reduced-pressure environment; a first heater configured to heat the plurality of substrates accommodated in the processing container; a plurality of gas supply pipes configured to supply a gas to positions having different heights in the processing container; and a second heater provided on a gas supply pipe that supplies a gas to a lowermost position among the plurality of gas supply pipes, and configured to heat the gas in the gas supply pipe.

16 Claims, 11 Drawing Sheets

(56) References Cited

U.S. PATENT DOCUMENTS

| | | | |
|---|---|---|---|
| 2016/0203976 A1* | 7/2016 | Joda | H01L 21/02222 |
| | | | 438/781 |
| 2018/0135176 A1* | 5/2018 | Morikawa | C23C 16/4486 |
| 2018/0211824 A1* | 7/2018 | Kudo | H01L 21/31116 |
| 2019/0206705 A1* | 7/2019 | Takeda | H01L 21/31 |
| 2019/0287829 A1* | 9/2019 | Saido | C23C 16/45546 |
| 2019/0341278 A1* | 11/2019 | Kang | H01L 21/67109 |

FOREIGN PATENT DOCUMENTS

| | | |
|---|---|---|
| JP | 2011-187884 A | 9/2011 |
| JP | 2017-047686 A | 3/2017 |
| JP | 2018-157028 A | 10/2018 |

\* cited by examiner

US 11,581,201 B2

HEAT TREATMENT APPARATUS AND FILM DEPOSITION METHOD

CROSS-REFERENCE TO RELATED APPLICATION

This application is based on and claims priority from Japanese Patent Application No. 2019-053842 filed on Mar. 20, 2019 with the Japan Patent Office, the disclosure of which is incorporated herein in its entirety by reference.

TECHNICAL FIELD

The present disclosure relates to a heat treatment apparatus and a film deposition method.

BACKGROUND

A technique has been known in which a processing gas is activated by heating the processing gas in advance to a predetermined temperature using a heater provided outside a processing container before the processing gas is supplied into the processing container. The heated processing gas is then supplied into the processing container (see, e.g., Japanese Patent Laid-Open Publication No. 2001-345314).

SUMMARY

A heat treatment apparatus according to an aspect of the present disclosure includes: a processing container configured to accommodate and process a plurality of substrates in multiple tiers under a reduced-pressure environment; a first heater configured to heat the plurality of substrates accommodated in the processing container; a plurality of gas supply pipes configured to supply a gas to positions having different heights in the processing container; and a second heater provided on a gas supply pipe that supplies a gas to a lowermost position among the plurality of gas supply pipes, and configured to heat the gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
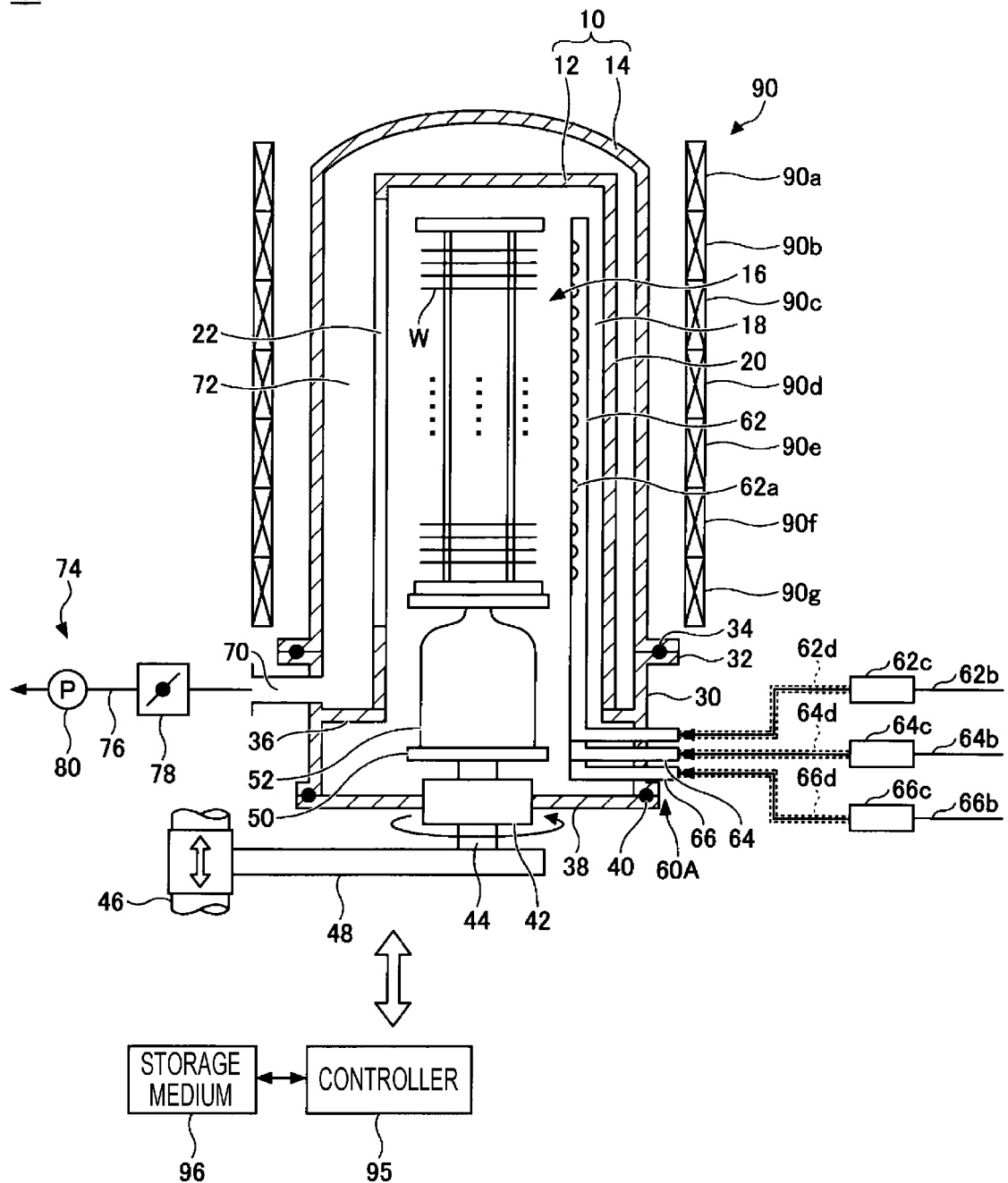
FIG. 1 is a cross-sectional view illustrating a configuration example of a heat treatment apparatus according to a first embodiment.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

First Embodiment (Heat Treatment Apparatus)

Figure 2:
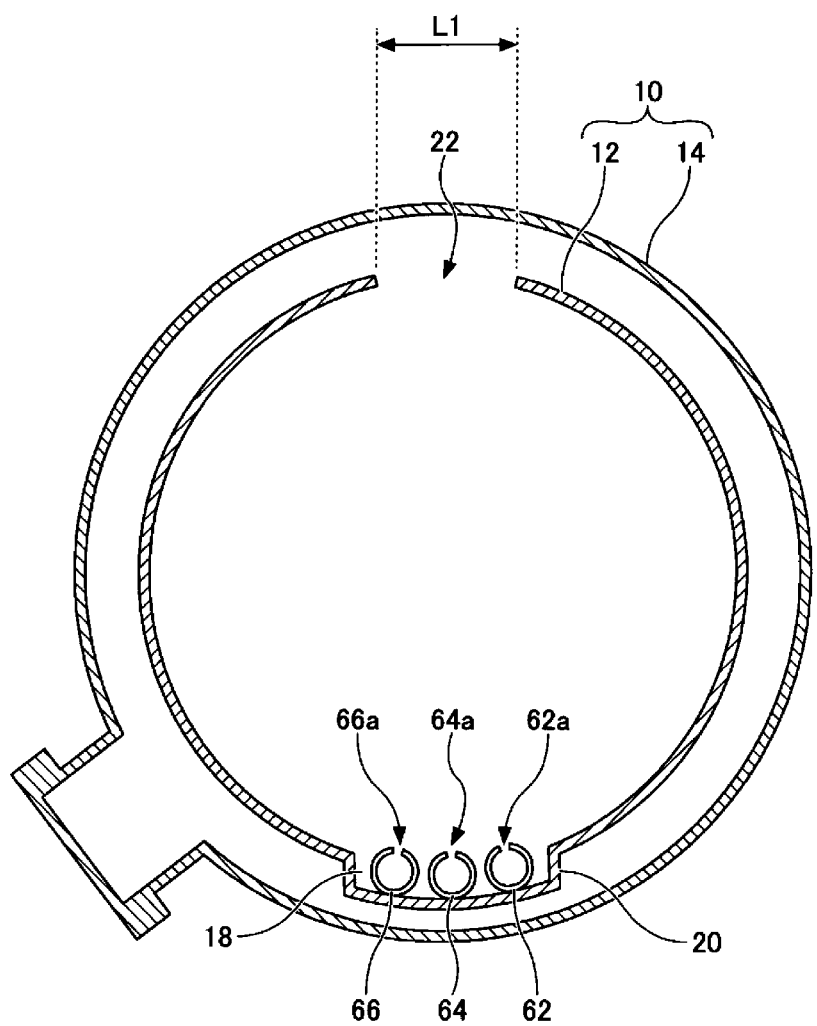
FIG. 2 is a view for explaining the arrangement of gas supply pipes in the heat treatment apparatus of FIG. 1.

A heat treatment apparatus of a first embodiment will be described. FIG. 1 is a cross-sectional view illustrating a configuration example of the heat treatment apparatus according to the first embodiment. FIG. 2 is a view for explaining the arrangement of gas supply pipes in the heat treatment apparatus of FIG. 1.

A heat treatment apparatus 1A has a processing container 10 whose inside may be depressurized. The processing container 10 accommodates a semiconductor wafer (hereinafter, referred to as a "wafer W") as a substrate.

The processing container 10 includes a cylindrical inner tube 12 having a ceiling with an open lower end, and a cylindrical outer tube 14 having a ceiling to cover the outside of the inner tube 12 with an open lower end. The inner tube 12 and the outer tube 14 are formed of a heat-resistant material such as quartz, and are arranged coaxially to form a double tube structure. A wafer boat 16 that holds a plurality of wafers W in shelves (in multiple tiers) at predetermined intervals in the height direction is carried into and out of the processing container 10.

The ceiling of the inner tube 12 is, for example, flat. On one side of the inner pipe 12, a nozzle accommodating section 18 which accommodates a gas supply pipe is formed along the longitudinal direction (vertical direction). The nozzle accommodating section 18 forms a convex portion 20 by projecting a part of the side wall of the inner tube 12 outward, and forms the inside of the convex portion 20 as the nozzle accommodating section 18. A rectangular opening 22 having a width L1 is formed in the side wall on the opposite side of the inner tube 12 so as to face the nozzle accommodating section 18 along the longitudinal direction (vertical direction). The width L1 is in the range of about 10 mm to 400 mm. The opening 22 is a gas exhaust port formed so that the gas in the inner pipe 12 may be exhausted.

The lower end of the processing container 10 is supported by a cylindrical manifold 30 formed of, for example, stainless steel. A flange portion 32 is formed at the upper end of the manifold 30, and the lower end of the outer tube 14 is installed and supported on the flange portion 32. A seal member 34 such as an O-ring is interposed between the flange portion 32 and the lower end of the outer tube 14 to make the inside of the outer tube 14 hermetic.

An annular support 36 is provided on the upper inner wall of the manifold 30, and the lower end of the inner tube 12 is installed on the support 36 to support it. A lid 38 is hermetically attached to an opening at the lower end of the manifold 30 via a sealing member 40 such as an O-ring, so that an opening at the lower end of the processing container 10, that is, the opening of the manifold 30 is hermetically closed. The lid 38 is formed of, for example, stainless steel.

A rotating shaft 44 is provided at the center of the lid 38 so as to penetrate through a magnetic fluid seal 42. The lower portion of the rotating shaft 44 is rotatably supported by an arm 48 of an elevating unit 46 composed of a boat elevator, and is rotated by a motor.

A rotating plate 50 is provided at the upper end of the rotating shaft 44, and the wafer boat 16 that holds the wafer W is placed on the rotating plate 50 via a heat insulating table 52 made of quartz. Therefore, the lid 38 and the wafer boat 16 move up and down as a unit by raising and lowering the elevating unit 46, so that the wafer boat 16 may be carried into and out of the processing container 10.

A gas supply 60A is provided in the manifold 30 and supplies a predetermined gas such as a processing gas and a purge gas into the inner pipe 12. The gas supply 60A has a plurality (e.g., three) of gas supply pipes 62, 64, and 66 made of quartz having the same length. Each of the gas supply pipes 62, 64, and 66 is provided in the inner pipe 12 along the longitudinal direction, and has a base end bent in an L-shape and supported so as to penetrate through the manifold 30.

As illustrated in FIG. 2, the gas supply pipes 62, 64, and 66 are installed in the nozzle accommodating section 18 of the inner pipe 12 so as to be aligned in a circumferential direction. Each of the gas supply pipes 62, 64, and 66 has a plurality of gas holes 62a, 64a, and 66a formed at predetermined intervals along the longitudinal direction. Each of the gas holes 62a, 64a, and 66a discharges each gas in the horizontal direction. The predetermined interval is set to be the same as, for example, an interval between the wafers W supported on the wafer boat 16. Further, the position in the height direction is set such that the gas holes 62a, 64a, and 66a are located in the middle between vertically adjacent wafers W, and each gas may be efficiently supplied to the space between the wafers W. As an example, the gas supply pipe 62 is a nozzle that supplies a first reaction gas, the gas supply pipe 64 is a nozzle that supplies a second reaction gas that reacts with the first reaction gas to form a reaction product, and the gas supply pipe 66 is a nozzle that supplies a purge gas. Examples of the first reaction gas include a silicon-containing gas and a metal-containing gas. Examples of the second reaction gas include a nitriding gas and an oxidizing gas. Examples of the purge gas include an inert gas.

A first reaction gas, a second reaction gas, and a purge gas are supplied to the gas supply pipes 62, 64, and 66 via gas pipes 62b, 64b, and 66b, respectively.

The gas pipes 62b, 64b, and 66b are provided with valves (not illustrated), mass flow controllers (not illustrated), heaters 62c, 64c, and 66c, and pipe heaters 62d, 64d, and 66d, respectively.

The heaters 62c, 64c, and 66c heat the gas flowing through the gas pipes 62b, 64b, and 66b, respectively. The set temperature of the heaters 62c, 64c, and 66c may be, for example, 100° C. to 200° C.

The pipe heaters 62d, 64d, and 66d suppress the gas heated by the heaters 62c, 64c, and 66c from decreasing in temperature when flowing through the gas pipes 62b, 64b, and 66b. The set temperature of the pipe heaters 62d, 64d, and 66d may be the same as, for example, the set temperature of the heaters 62c, 64c, and 66c and may be, for example, 100° C. to 200° C.

A gas outlet 70 is formed on the upper side wall of the manifold 30 and above the support 36, and the gas in the inner pipe 12 discharged from the opening 22 through a space 72 between the inner pipe 12 and the outer pipe 14 may be exhausted. The gas outlet 70 is provided with an exhaust unit 74. The exhaust unit 74 has an exhaust passage 76 connected to the gas outlet 70. A pressure regulating valve 78 and a vacuum pump 80 are sequentially provided in the exhaust passage 76 so that the inside of the processing container 10 may be evacuated to a vacuum.

A cylindrical heater 90 is provided on the outer peripheral side of the outer tube 14 so as to cover the outer tube 14. The heater 90 heats the wafer W accommodated in the processing container 10. The heater 90 is divided into a plurality of zones, and has seven heaters 90a to 90g provided from the upper side to the lower side in the vertical direction. Hereinafter, zones in which the heaters 90a, 90b, 90c, 90d, 90e, 90f, and 90g are provided are referred to as "zone 1," "zone 2," "zone 3," "zone 4," "zone 5," "zone 6," and "zone 7," respectively. The heaters 90a to 90g are configured such that the amount of heat generated may be independently controlled by a power controller (not illustrated).

In addition, FIG. 1 illustrates an embodiment in which the heater 90 is divided into seven zones. However, the present disclosure is not limited to this, and the heater 90 may be divided into, for example, six or less zones, or eight or more zones from the upper side to the lower side in the vertical direction. Further, the heater 90 may be constituted by one zone without being divided into a plurality of zones.

An entire operation of the heat treatment apparatus 1A is controlled by, for example, a controller 95 such as a computer. Further, a computer program that performs the entire operation of the heat treatment apparatus 1A is stored in a storage medium 96. The storage medium 96 may be, for example, a flexible disk, a compact disk, a hard disk, a flash memory, a DVD, or the like.

(Film Deposition Method)

Figure 3:
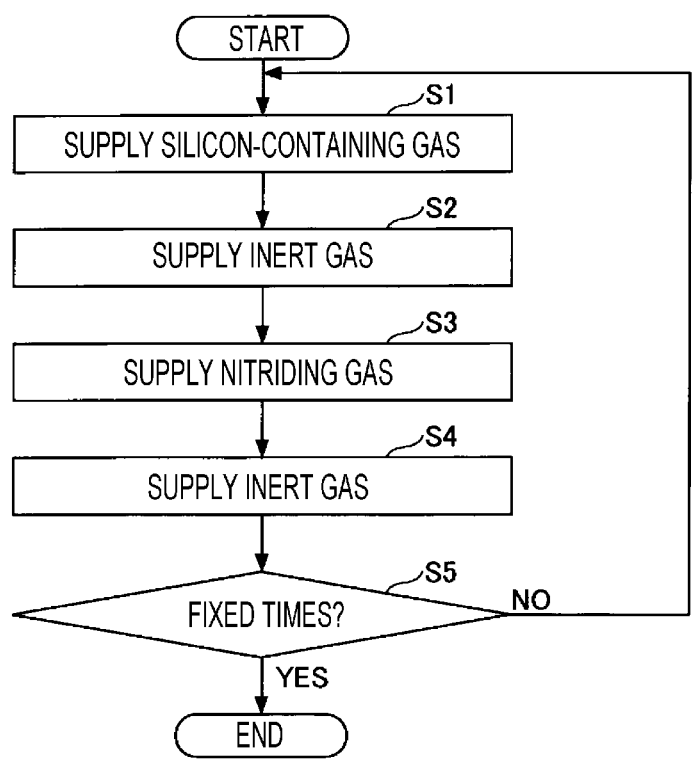
FIG. 3 is a flowchart illustrating an example of an ALD method.

As an example of a film deposition method using the heat treatment apparatus 1A, a method of forming a silicon nitride film on the wafer W by an atomic layer deposition (ALD) method will be described. FIG. 3 is a flowchart illustrating an example of the ALD method.

First, the wafer boat 16 holding a plurality of wafers W is carried into the processing container 10 by the elevating unit 46, and the opening at the lower end of the processing container 10 is hermetically closed by the lid 38 and hermetically sealed. Subsequently, the exhaust unit 74 performs an evacuation so that the pressure in the processing chamber 10 becomes a predetermined pressure, and the wafer W in the processing chamber 10 is heated by the heater 90 to rotate the wafer boat 16.

Subsequently, a silicon-containing gas from the gas supply pipe 62 (step S1), an inert gas from the gas supply pipe 66 (step S2), a nitriding gas from the gas supply pipe 64 (step S3), and an inert gas from the gas supply pipe 66 (step S4) are intermittently supplied in this order. Thus, the silicon-containing gas is first adsorbed on the wafer W in the step S1 of supplying the silicon-containing gas, and the surplus silicon-containing gas is purged in the next step S2 of supplying the inert gas. Then, the nitriding gas supplied in the next step S3 of supplying the nitriding gas is reacted with the silicon-containing gas, and the surplus nitriding gas is purged in the next step S4 of supplying the inert gas, thereby forming a thin unit film which is a substantially monomolecular layer. This series of cycles is performed a predetermined number of times (step S5) to form a silicon nitride film having a desired film thickness.

As described above, in the ALD method, the silicon-containing gas and the nitriding gas are alternately supplied into the processing container 10 with the purge gas interposed therebetween in a short time. Therefore, in order to supply a predetermined amount of gas within a predetermined time, it is preferable that a large flow rate (e.g., 10 slm or more) of gas may be supplied from the gas supply pipes 62, 64, and 66.

However, in the heat treatment apparatus 1A, since each gas is discharged in the horizontal direction from the plurality of gas holes 62a, 64a, and 66a, the gas is supplied to the wafer W from the peripheral side, and the gas flows on the wafer W from the peripheral portion to the central portion. Therefore, when supplying a large flow rate of gas into the processing container 10, and when the gas discharged from the gas holes 62a, 64a, and 66a is not sufficiently heated, the temperature of the peripheral portion of the wafer W decreases due to the gas. As a result, a temperature difference occurs between the central portion and the peripheral portion of the wafer W, and the in-plane uniformity of the wafer temperature deteriorates.

Further, in the heat treatment apparatus 1A, the gas flows upward from below in the gas supply pipes 62, 64, and 66 provided in the inner pipe 12 along the longitudinal direction. At this time, when the gas supplied to the gas supply pipes 62, 64, and 66 is not sufficiently heated, the gas is heated by the heater 90 when flowing through the gas supply pipes 62, 64, and 66. Then, the temperature of the gas supplied to a lower zone in the processing container 10 becomes lower than the temperature of the gas supplied to an upper zone in the processing container 10. As a result, the inter-plane uniformity of the wafer temperature deteriorates. Also, the temperature difference increases as the flow rate of the gas supplied from the gas supply pipes 62, 64, and 66 into the processing container 10 increases.

Therefore, in the first embodiment, when supplying a large flow rate of gas into the processing container 10, the gas is heated to a predetermined temperature by the heaters 62c, 64c, and 66c and the pipe heaters 62d, 64d, and 66d. Thus, even when a large flow rate of gas is supplied into the processing container 10, since a sufficiently heated gas is supplied into the processing container 10, it is possible to suppress the decrease in temperature of the peripheral portion of the wafer W. As a result, the in-plane uniformity of the wafer temperature deteriorates. Further, since the temperature difference between the gas supplied to the lower zone and the gas supplied to the upper zone in the processing container 10 is reduced, the inter-plane uniformity of the wafer temperature is improved.

In the ALD method, in order to purge the first reaction gas and the second reaction gas remaining in the processing container 10 in a short time, in many cases, the purge gas is supplied at a larger flow rate than the first reaction gas or the second reaction gas. Therefore, the purge gas may be heated by the heater 66c and the pipe heater 66d, and the first reaction gas and the second reaction gas may be heated only by the pipe heaters 62d and 64d. Further, when a distance between the gas supply pipes 62, 64, and 66 and the heaters 62c, 64c, and 66c is short, the pipe heaters 62d, 64d, and 66d may not be provided.

In the above embodiment, the ALD method has been described as an example of the film deposition method. However, the present disclosure is not limited to this, and may be similarly applied to, for example, a chemical vapor deposition (CVD) method.

(Evaluation)

An evaluation result performed to confirm the effects of a first embodiment using the heat treatment apparatus 1A will be described.

First, a wafer boat 16 holding a plurality of wafers W is accommodated in the processing container 10, and the power supplied to the heaters 90a to 90g is controlled so that the temperature of the wafer W becomes 240° C. and the amounts of heat generated by the heaters 90a to 90g are adjusted. Further, the set temperature of the heater 66c is adjusted to 200° C., the set temperature of the pipe heater 66d is adjusted to 100° C., and a nitrogen ($N_2$) gas heated at a flow rate of 40 slm is supplied into the processing container 10 from the gas supply pipe 66.

Figure 4:
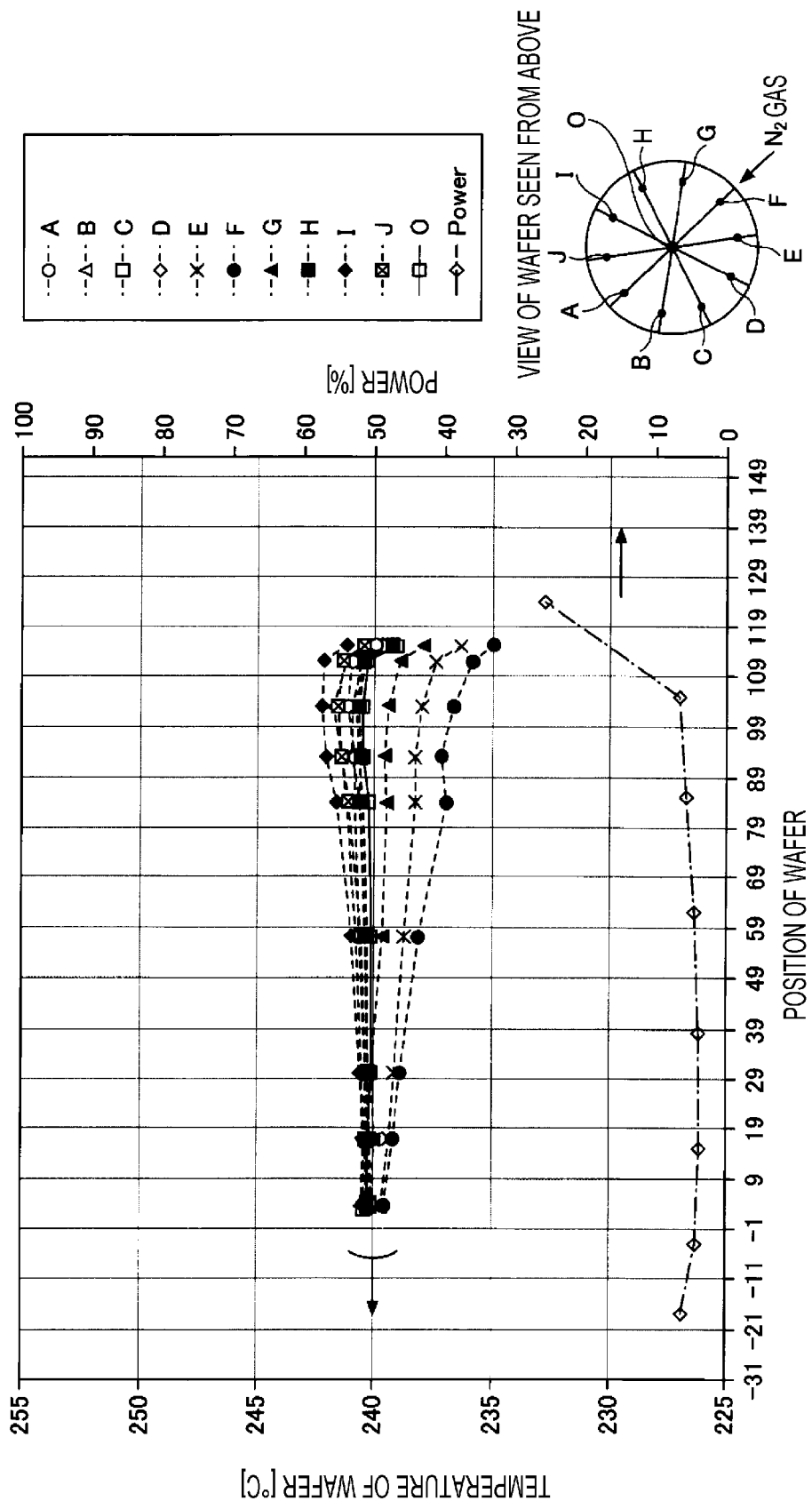
FIG. 4 is a diagram (1) for explaining the effect of the heat treatment apparatus according to the first embodiment.

Subsequently, with respect to a part of the plurality of wafers W held by the wafer boat 16, the temperature is measured at one point at the central portion and at ten points at the peripheral portion. The measurement results are illustrated in FIG. 4. In FIG. 4, the horizontal axis indicates the wafer position in the wafer boat 16, a first vertical axis indicates the wafer temperature ['C], and a second vertical axis indicates the power [%] supplied to the heater 90. In FIG. 4, the uppermost position of the wafer boat 16 is indicated by a wafer position "1," and the lowermost position thereof is indicated by a wafer position "115." Further, in FIG. 4, the measurement result of the central portion O of the wafer W is indicated by a solid line, the measurement results of the peripheral portions A to J of the wafer W are indicated by a broken line, and the power supplied to the heater 90 is indicated by a dashed line. In addition, the nitrogen gas is supplied from the peripheral edge F side of the wafer W.

Further, for comparison, a wafer boat 16 holding a plurality of wafers W is accommodated in the processing container 10, and the power supplied to the heaters 90a to 90g is controlled so that the temperature of the wafer W becomes 240° C. and the amounts of heat generated by the heaters 90a to 90g are adjusted. In addition, the heater 66c is turned off, the set temperature of the pipe heater 66d is adjusted to 100° C., and the nitrogen gas is supplied from the gas supply pipe 66 into the processing container 10 at a flow rate of 40 slm.

Figure 5:
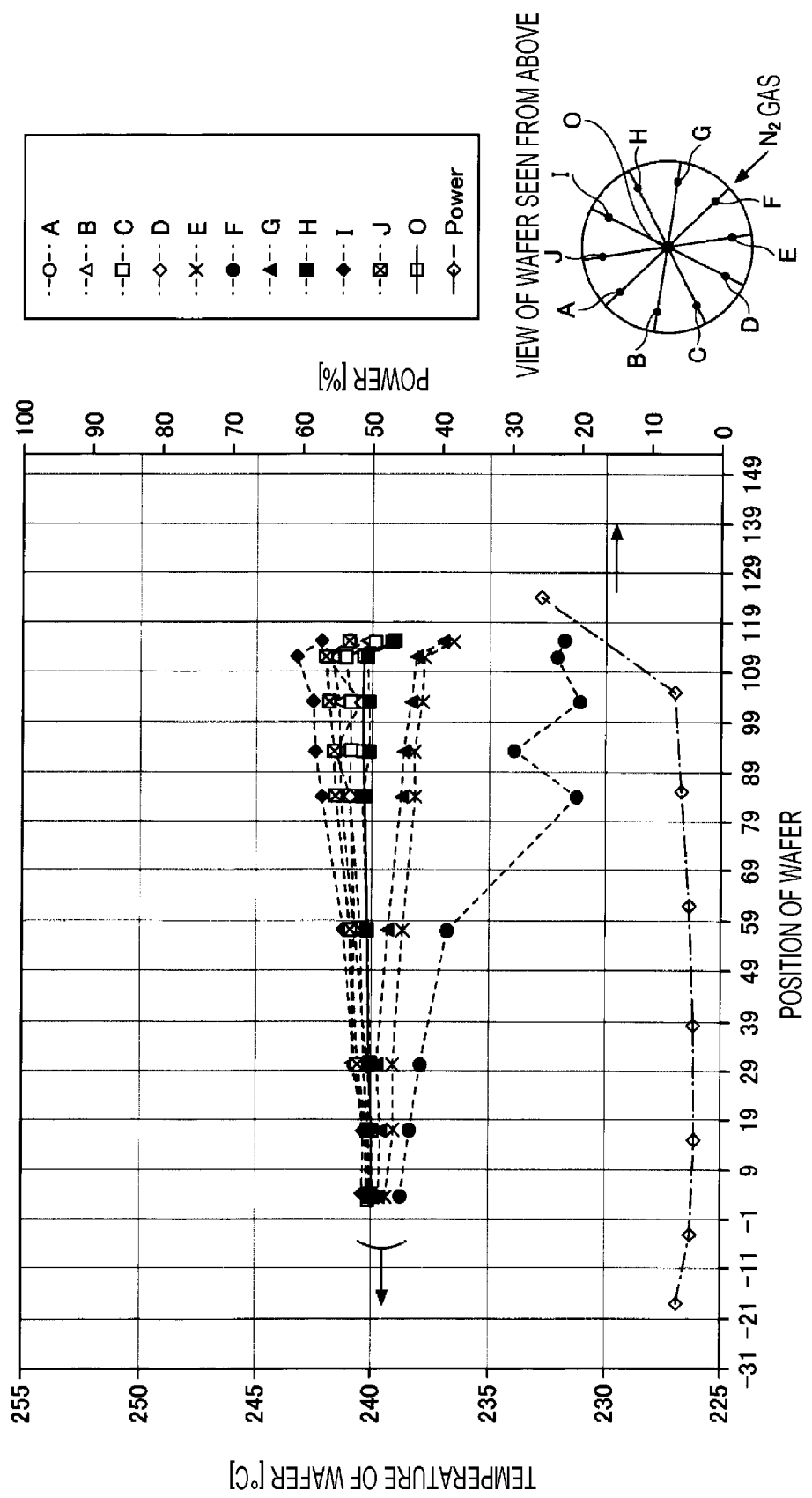
FIG. 5 is a diagram (2) for explaining the effect of the heat treatment apparatus according to the first embodiment.

Subsequently, with respect to a part of the plurality of wafers W held by the wafer boat 16, the temperature is measured at one point at the central portion and at ten points at the peripheral portion. The measurement results are illustrated in FIG. 5. In FIG. 5, the horizontal axis indicates the wafer position in the wafer boat 16, the first vertical axis indicates the wafer temperature ['C], and the second vertical axis indicates the power [%] supplied to the heater 90. In FIG. 5, the uppermost position of the wafer boat 16 is indicated by a wafer position "1," and the lowermost position thereof is indicated by a wafer position "115." Further, in FIG. 5, the measurement result of the central portion O of the wafer W is indicated by a solid line, the measurement results of the peripheral portions A to J of the wafer W are indicated by a broken line, and the power supplied to the heater 90 is indicated by a dashed line. In addition, the nitrogen gas is supplied from the peripheral edge F side of the wafer W.

As illustrated in FIG. 4, when the nitrogen gas is heated by the heater 66c, the inter-plane uniformity and the in-plane uniformity of the wafer temperature are good. Meanwhile, as illustrated in FIG. 5, when the heating of the nitrogen gas by the heater 66c is not performed, the wafer temperature near the gas supply pipe 66 (e.g., the peripheral portion F) is lowered. Further, in the zone below the processing container 10 (e.g., wafer positions 85 to 115), the wafer temperature is remarkably lowered.

From the above results, it may be said that the film deposition method of the first embodiment may improve the temperature uniformity in the large flow rate process.

Second Embodiment (Heat Treatment Apparatus)

Figure 6:
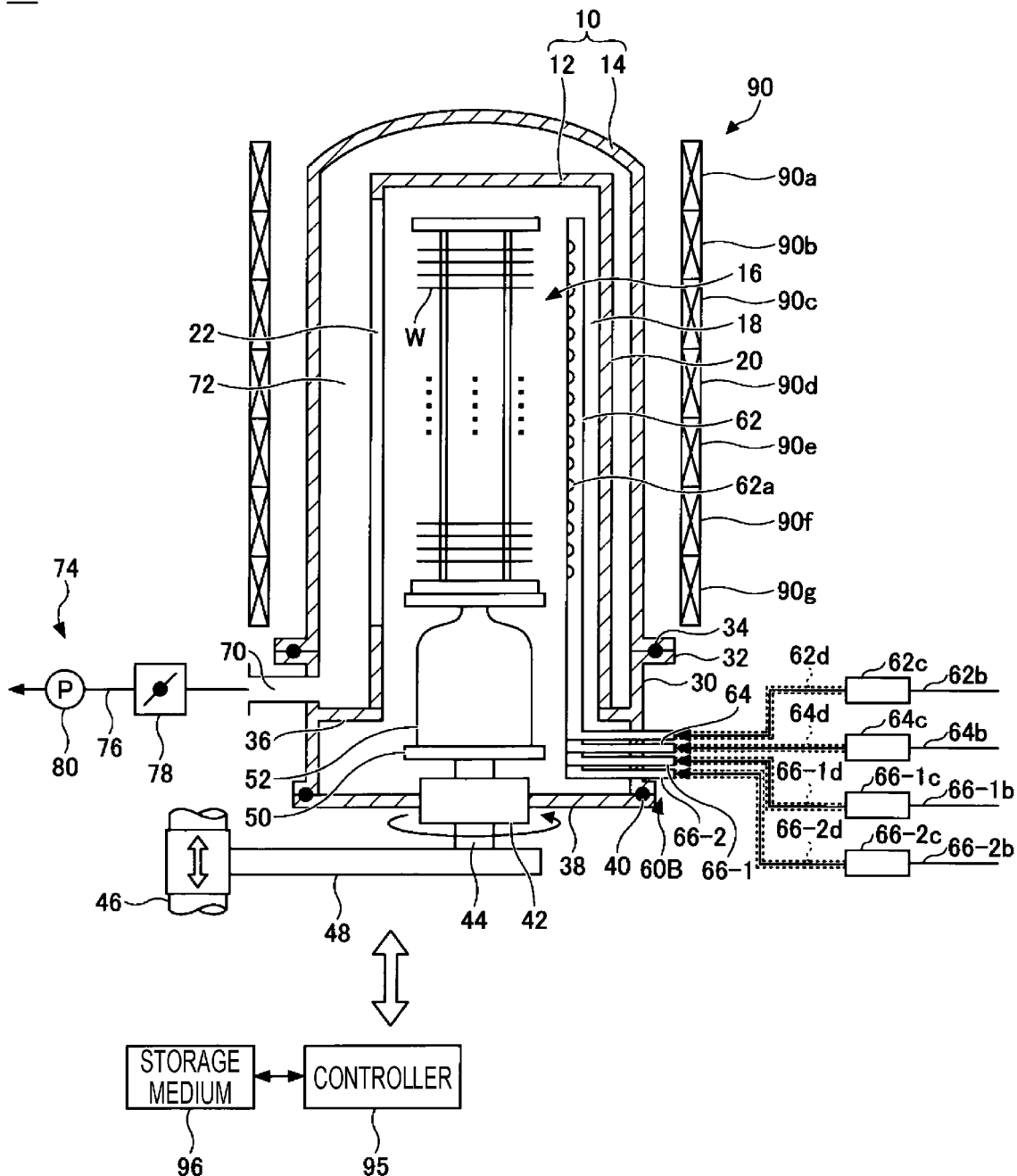
FIG. 6 is a cross-sectional view illustrating a configuration example of a heat treatment apparatus according to a second embodiment.
Figure 7:
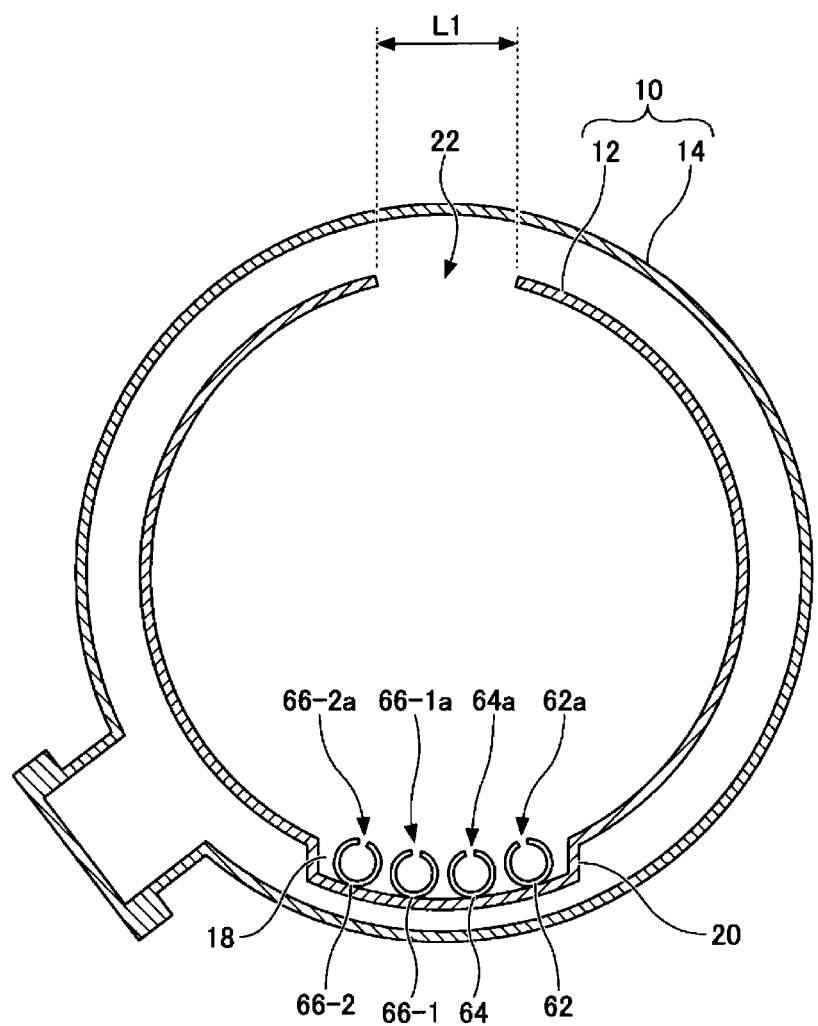
FIG. 7 is a view for explaining the arrangement of gas supply pipes in the heat treatment apparatus of FIG. 6.

A heat treatment apparatus of a second embodiment will be described. FIG. 6 is a cross-sectional view illustrating a configuration example of the heat treatment apparatus according to the second embodiment. FIG. 7 is a view for explaining the arrangement of gas supply pipes in the heat treatment apparatus of FIG. 6.

A heat treatment apparatus 1B of the second embodiment is different from the heat treatment apparatus 1A of the first embodiment in that a nozzle which supplies a purge gas is formed by two gas supply pipes 66-1 and 66-2 having the same length. The other points are the same as those of the heat treatment apparatus 1A of the first embodiment, and therefore, different points will be mainly described.

A gas supply 60B is provided in the manifold 30 and supplies a predetermined gas such as a processing gas and a purge gas into the inner pipe 12. The gas supply 60A has a plurality (e.g., four) of gas supply pipes 62, 64, 66-1, and 66-2 made of quartz having the same length. Each of the gas supply pipes 62, 64, 66-1, and 66-2 is provided in the inner pipe 12 along the longitudinal direction, and has a base end bent in an L-shape and supported so as to penetrate through the manifold 30.

As illustrated in FIG. 7, the gas supply pipes 62, 64, 66-1, and 66-2 are installed in the nozzle accommodating section 18 of the inner pipe 12 so as to be aligned in a circumferential direction. Each of the gas supply pipes 62, 64, 66-1, and 66-2 has a plurality of gas holes 62a, 64a, 66-1a, and 66-2a formed at predetermined intervals along the longitudinal direction. Each of the gas holes 62a, 64a, 66-1a, and 66-2a discharges each gas in the horizontal direction. The predetermined interval is set to be the same as, for example, the interval between the wafers W supported on the wafer boat 16. Further, the position in the height direction is set such that the gas holes 62a, 64a, 66-1a, and 66-2a are located in the middle between vertically adjacent wafers W, and each gas may be efficiently supplied to the space between the wafers W. As an example, the gas supply pipe 62 is a nozzle that supplies a first reaction gas, the gas supply pipe 64 is a nozzle that supplies a second reaction gas which reacts with the first reaction gas to form a reaction product, and the gas supply pipes 66-1 and 66-2 are nozzles that supply a purge gas. Examples of the first reaction gas include a silicon-containing gas and a metal-containing gas. Examples of the second reaction gas include a nitriding gas and an oxidizing gas. Examples of the purge gas include an inert gas.

A first reaction gas is supplied to the gas supply pipe 62 via the gas pipe 62b. A second reaction gas is supplied to the gas supply pipe 64 via the gas pipe 64b. A purge gas is supplied to the gas supply pipes 66-1 and 66-2 via gas pipes 66-1b and 66-2b, respectively.

The gas pipes 62b, 64b, 66-1b, and 66-2b are provided with valves (not illustrated), mass flow controllers (not illustrated), heaters 62c, 64c, 66-1c, and 66-2c, and pipe heaters 62d, 64d, 66-1d, and 66-2d, respectively.

The heaters 62c, 64c, 66-1c, and 66-2c heat the gas flowing through the gas pipes 62b, 64b, 66-1b, and 66-2b, respectively. The set temperature of the heaters 62c, 64c, 66-1c, and 66-2c may be, for example, 100° C. to 200° C.

The pipe heaters 62d, 64d, 66-1d, and 66-2d suppress the gas heated by the heaters 62c, 64c, 66-1c, and 66-2c from decreasing in temperature when flowing through the gas pipes 62b, 64b, 66-1b, and 66-2b. The set temperature of the pipe heaters 62d, 64d, 66-1d, and 66-2d may be the same as, for example, the set temperature of the heaters 62c, 64c, 66-1c, and 66-2c and may be, for example, 100° C. to 200° C.

(Film Deposition Method)

As an example of a film deposition method using the heat treatment apparatus 1B, a method of forming a silicon nitride film on a wafer W by an ALD method will be described.

First, the wafer boat 16 holding a plurality of wafers W is carried into the processing container 10 by the elevating unit 46, and the opening at the lower end of the processing container 10 is hermetically closed by the lid 38 and hermetically sealed. Subsequently, the exhaust unit 74 performs an evacuation so that the pressure in the processing chamber 10 becomes a predetermined pressure, and the wafer W in the processing chamber 10 is heated by the heater 90 to rotate the wafer boat 16.

Subsequently, a silicon-containing gas from the gas supply pipe 62, an inert gas from the gas supply pipes 66-1 and 66-2, a nitriding gas from the gas supply pipe 64, and an inert gas from the gas supply pipes 66-1 and 66-2 are intermittently supplied in this order. Thus, the silicon-containing gas is first adsorbed on the wafer W in the step of supplying the silicon-containing gas, and the surplus silicon-containing gas is purged in the next step of supplying the inert gas. Then, the nitriding gas supplied in the next step of supplying the nitriding gas is reacted with the silicon-containing gas, and the surplus nitriding gas is purged in the next step of supplying the inert gas, thereby forming a thin unit film which is a substantially monomolecular layer. This series of cycles is performed a predetermined number of times to form a silicon nitride film having a desired film thickness.

As described above, in the ALD method, the silicon-containing gas and the nitriding gas are alternately supplied into the processing container 10 with the purge gas interposed therebetween in a short time. Therefore, in order to supply a predetermined amount of gas within a predetermined time, it is preferable that a large flow rate (e.g., 10 slm or more) of gas may be supplied from the gas supply pipes 62, 64, 66-1, and 66-2.

However, in the heat treatment apparatus 1B, since each gas is discharged in the horizontal direction from the plurality of gas holes 62a, 64a, 66-1a, and 66-2a, the gas is supplied to the wafer W from the peripheral side, and the gas flows on the wafer W from the peripheral portion to the central portion. Therefore, when supplying a large flow rate of gas into the processing container 10, and when the gas discharged from the gas holes 62a, 64a, 66-1a, and 66-2a is not sufficiently heated, the temperature of the peripheral portion of the wafer W decreases due to the gas. As a result, a temperature difference occurs between the central portion and the peripheral portion of the wafer W, and the in-plane uniformity of the wafer temperature deteriorates.

Further, in the heat treatment apparatus 1B, the gas flows upward from below in the gas supply pipes 62, 64, 66-1, and 66-2 provided in the inner pipe 12 along the longitudinal direction. At this time, when the gas supplied to the gas supply pipes 62, 64, 66-1, and 66-2 is not sufficiently heated, the gas is heated by the heater 90 when flowing through the gas supply pipes 62, 64, 66-1, and 66-2. Then, the temperature of the gas supplied to a lower zone in the processing container 10 becomes lower than the temperature of the gas supplied to an upper zone in the processing container 10. As a result, the inter-plane uniformity of the wafer temperature deteriorates. Also, the temperature difference increases as the flow rate of the gas supplied from the gas supply pipes 62, 64, 66-1, and 66-2 into the processing container 10 increases.

Therefore, in the second embodiment, when supplying a large flow rate of gas into the processing container 10, the gas is heated to a predetermined temperature by the heaters 62c, 64c, 66-1c, and 66-2c and the pipe heaters 62d, 64d, 66-1d, and 66-2d. Thus, even when a large flow rate of gas is supplied into the processing container 10, since a sufficiently heated gas is supplied into the processing container 10, it is possible to suppress the decrease in temperature of the peripheral portion of the wafer W. As a result, the in-plane uniformity of the wafer temperature is improved. Further, since the temperature difference between the gas supplied to the lower zone and the gas supplied to the upper zone in the processing container 10 is reduced, the inter-plane uniformity of the wafer temperature is improved.

In particular, in the second embodiment, the purge gas, which is often supplied at a large flow rate, is simultaneously supplied into the processing container 10 through the two gas supply pipes 66-1 and 66-2. Therefore, the purge gas is more likely to be heated as compared with a case where the same flow rate of the purge gas is supplied from one gas supply pipe 66. As a result, the in-plane uniformity and the inter-plane uniformity of the wafer temperature are further improved.

In the ALD method, in order to purge the first reaction gas and the second reaction gas remaining in the processing container 10 in a short time, in many cases, the purge gas is supplied at a larger flow rate than the first reaction gas or the second reaction gas. Therefore, the purge gas may be heated by the heaters 66-1c and 66-2c and the pipe heaters 66-1d and 66-2d, and the first reaction gas and the second reaction gas may be heated only by the pipe heaters 62d and 64d. Further, when a distance between the gas supply pipes 62, 64, 66-1, and 66-2 and the heaters 62c, 64c, 66-1c, and 66-2c is short, the pipe heaters 62d, 64d, 66-1d, and 66-2d may not be provided.

In the above embodiment, the ALD method has been described as an example of the film deposition method. However, the present disclosure is not limited to this, and may be similarly applied to, for example, a CVD method.

Further, in the above embodiment, descriptions have been made on a case where the purge gas is supplied through the two gas supply pipes 66-1 and 66-2 having the same length. However, the present disclosure is not limited to this, and a purge gas may be supplied through, for example, three or more gas supply pipes having the same length. In addition, the first reaction gas and the second reaction gas may be supplied through a plurality of gas supply pipes having the same length.

(Evaluation)

An evaluation result performed to confirm the effects of a second embodiment using the heat treatment apparatus 1B will be described.

First, a wafer boat 16 holding a plurality of wafers W is accommodated in the processing container 10, and the power supplied to the heaters 90a to 90g is controlled so that the temperature of the wafer W becomes 240° C. and the amounts of heat generated by the heaters 90a to 90g are adjusted. In addition, the heaters 66-1c and 66-2c are turned off, the set temperature of the pipe heaters 66-1d and 66-2d is adjusted to 100° C., and the nitrogen gas is supplied from two gas supply pipes 66-1 and 66-2 into the processing container 10 at a flow rate of 20 slm (total of 40 slm).

Figure 8:
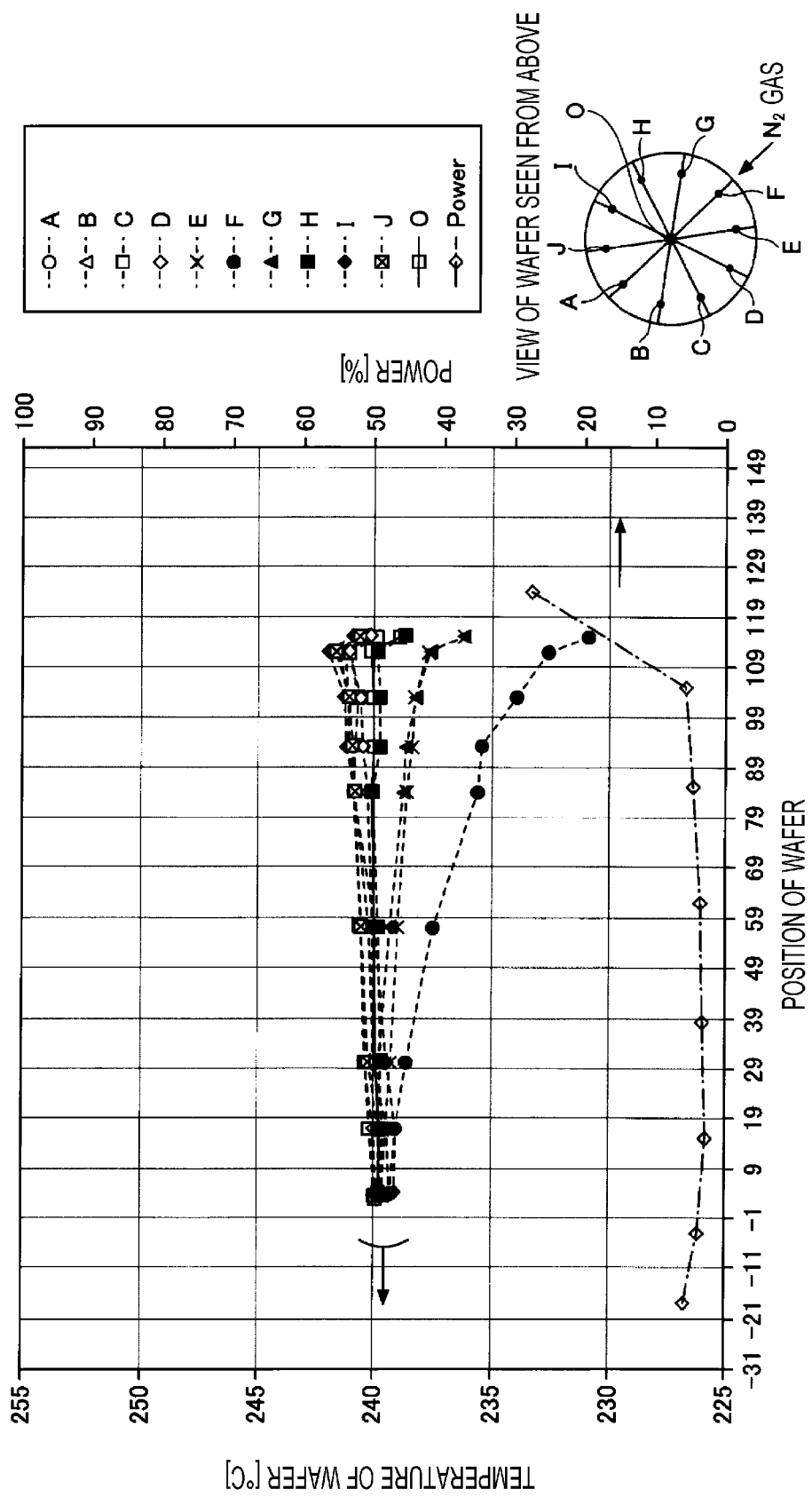
FIG. 8 is a diagram (1) for explaining the effect of the heat treatment apparatus according to the second embodiment.

Subsequently, with respect to a part of the plurality of wafers W held by the wafer boat 16, the temperature is measured at one point at the central portion and at ten points at the peripheral portion. The measurement results are illustrated in FIG. 8. In FIG. 8, the horizontal axis indicates the wafer position in the wafer boat 16, the first vertical axis indicates the wafer temperature [° C.], and the second vertical axis indicates the power [%] supplied to the heater 90. In FIG. 8, the uppermost position of the wafer boat 16 is indicated by a wafer position "1," and the lowermost position thereof is indicated by a wafer position "115." Further, in FIG. 8, the measurement result of the central portion O of the wafer W is indicated by a solid line, the measurement results of the peripheral portions A to J of the wafer W are indicated by a broken line, and the power supplied to the heater 90 is indicated by a dashed line. In addition, the nitrogen gas is supplied from the peripheral edge F side of the wafer W.

Further, for comparison, a wafer boat 16 holding a plurality of wafers W is accommodated in the processing container 10 using the heat treatment apparatus 1A, and the power supplied to the heaters 90a to 90g is controlled so that the temperature of the wafer W becomes 240° C. and the amounts of heat generated by the heaters 90a to 90g are adjusted. In addition, the heater 66c is turned off, the set temperature of the pipe heater 66d is adjusted to 100° C., and the nitrogen gas is supplied from one gas supply pipe 66 into the processing container 10 at a flow rate of 40 slm.

Figure 9:
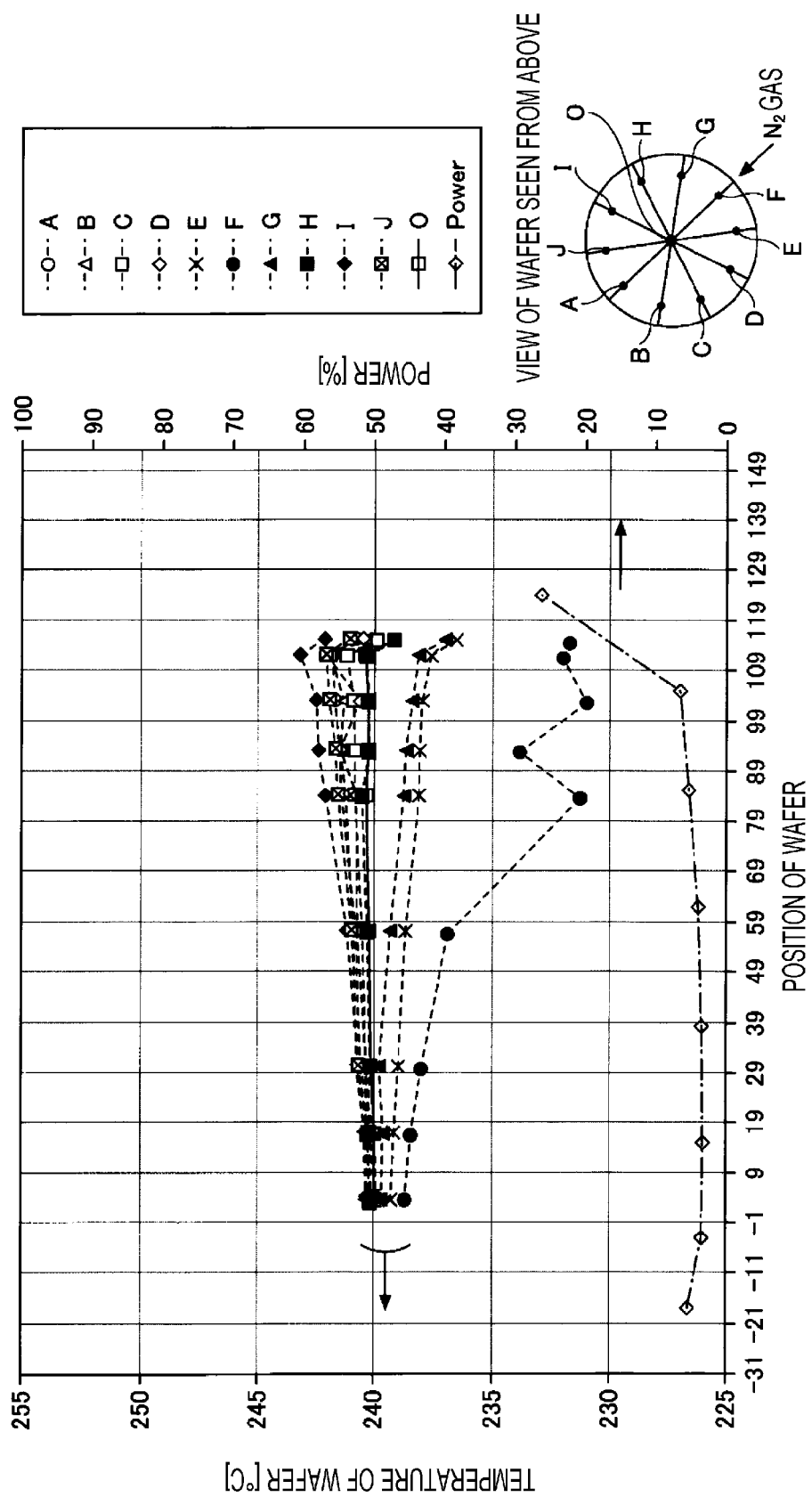
FIG. 9 is a diagram (2) for explaining the effect of the heat treatment apparatus according to the second embodiment.

Subsequently, with respect to a part of the plurality of wafers W held by the wafer boat 16, the temperature is measured at one point at the central portion and at ten points at the peripheral portion. The measurement results are illustrated in FIG. 9. In FIG. 9, the horizontal axis indicates the wafer position in the wafer boat 16, the first vertical axis indicates the wafer temperature ['C], and the second vertical axis indicates the power [%] supplied to the heater 90. In FIG. 9, the uppermost position of the wafer boat 16 is indicated by a wafer position "1," and the lowermost position thereof is indicated by a wafer position "115." Further, in FIG. 9, the measurement result of the central portion O of the wafer W is indicated by a solid line, the measurement results of the peripheral portions A to J of the wafer W are indicated by a broken line, and the power supplied to the heater 90 is indicated by a dashed line. In addition, the nitrogen gas is supplied from the peripheral edge F side of the wafer W.

As illustrated in FIGS. 8 and 9, when the nitrogen gas is supplied from the two gas supply pipes 66-1 and 66-2 into the processing chamber 10, the in-plane uniformity and the inter-plane uniformity of the wafer temperature are improved as compared with a case where the nitrogen gas is supplied from one gas supply pipe 66 into the processing container 10.

From the above results, it may be said that the film deposition method of the second embodiment may improve the temperature uniformity in the large flow rate process.

Third Embodiment (Heat Treatment Apparatus)

Figure 10:
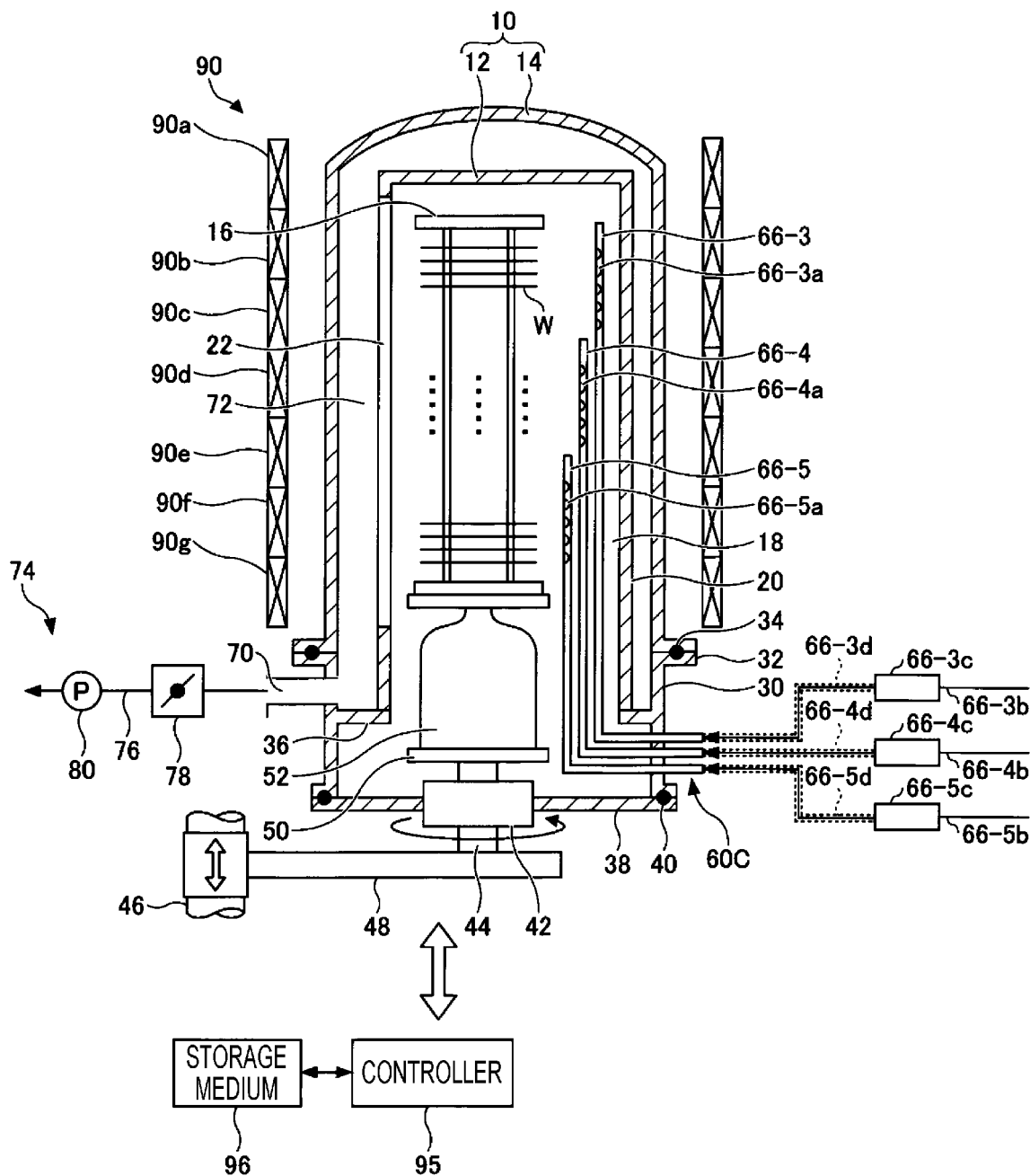
FIG. 10 is a cross-sectional view illustrating a configuration example of a heat treatment apparatus according to a third embodiment.
Figure 11:
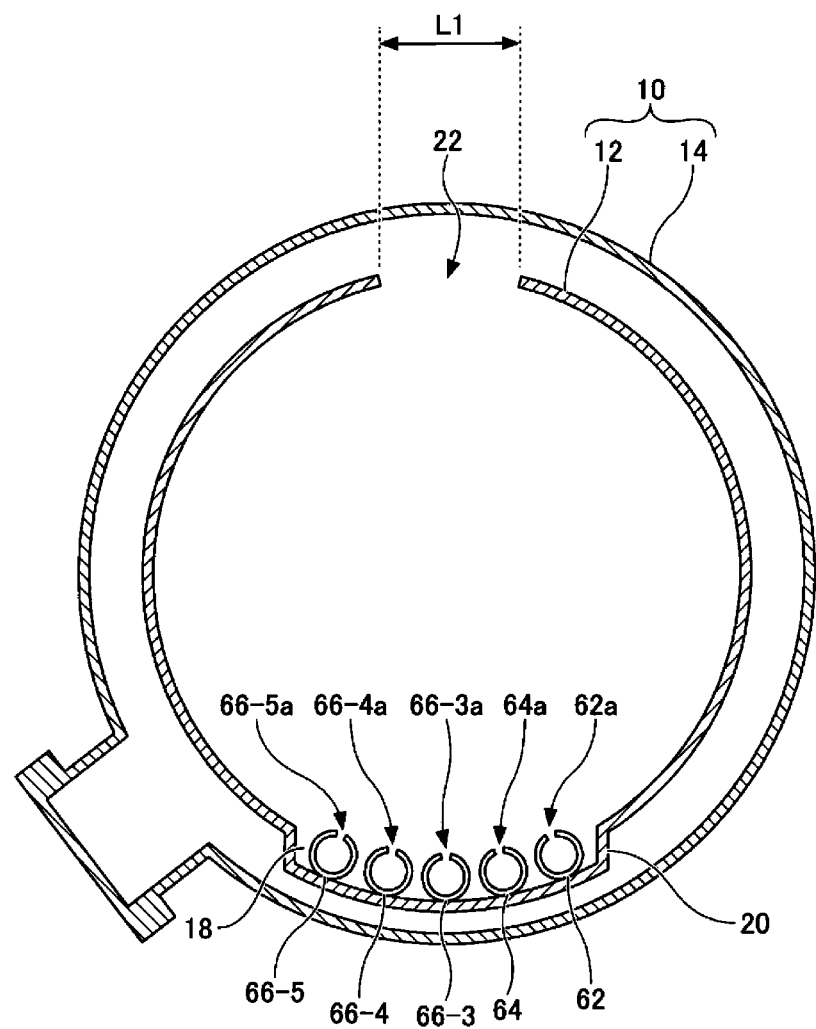
FIG. 11 is a view for explaining the arrangement of gas supply pipes in the heat treatment apparatus of FIG. 10.

A heat treatment apparatus of a third embodiment will be described. FIG. 10 is a cross-sectional view illustrating a configuration example of the heat treatment apparatus according to the third embodiment. FIG. 11 is a view for explaining the arrangement of gas supply pipes in the heat treatment apparatus of FIG. 10. In FIG. 10, illustration of the gas supply pipes 62 and 64 is omitted for convenience of explanation.

A heat treatment apparatus 1C of the third embodiment is different from the heat treatment apparatus 1A of the first embodiment in that a nozzle which supplies a purge gas is formed by three gas supply pipes 66-3, 66-4, and 66-5 having different lengths. The other points are the same as those of the heat treatment apparatus 1A of the first embodiment, and therefore, different points will be mainly described.

A gas supply 60C is provided in the manifold 30 and supplies a predetermined gas such as a processing gas and a purge gas into the inner pipe 12. The gas supply 60C has gas supply pipes 62 and 64 having the same length and made of quartz, and gas supply pipes 66-3, 66-4 and 66-5 having different lengths and made of quartz. Each of the gas supply pipes 62, 64, 66-3, 66-4, and 66-5 is provided in the inner pipe 12 along the longitudinal direction, and has a base end bent in an L-shape and supported so as to penetrate through the manifold 30. As illustrated in FIG. 11, the gas supply pipes 62, 64, 66-3, 66-4, and 66-5 are installed in the nozzle accommodating section 18 of the inner pipe 12 so as to be aligned in a circumferential direction. The gas supply pipes 62 and 64 have the same configuration as that of the first embodiment.

Each of the gas supply pipes 66-3, 66-4, and 66-5 has a plurality of gas holes 66-3a, 66-4a, and 66-5a formed at predetermined intervals along the longitudinal direction in the upper portion of the inner pipe 12. Each of the gas holes 66-3a, 66-4a, and 66-5a discharges each gas in the horizontal direction. As described above, the gas supply pipes 66-3, 66-4, and 66-5 may independently discharge gas to the upper portion, the central portion, and the lower portion in the inner pipe 12. The predetermined interval is set to be the same as, for example, the interval between the wafers W supported on the wafer boat 16. Further, the position in the height direction is set such that the gas holes 66-3a, 66-4a, and 66-5a are located in the middle between vertically adjacent wafers W, and each gas may be efficiently supplied to the space between the wafers W. As an example, the gas supply pipes 66-3, 66-4, and 66-5 are nozzles that supply a purge gas. Examples of the purge gas include an inert gas.

A purge gas is supplied to the gas supply pipes 66-3, 66-4, and 66-5 via gas pipes 66-3b, 66-4b, and 66-5b, respectively.

The gas pipes 66-3b, 66-4b, and 66-5b are provided with valves (not illustrated), mass flow controllers (not illustrated), heaters 66-3c, 66-4c, and 66-5c, and pipe heaters 66-3d, 66-4d, and 66-5d, respectively.

The heaters 66-3c, 66-4c, and 66-5c heat the gas flowing through the gas pipes 66-3b, 66-4b, and 66-5b, respectively. The set temperature of the heaters 66-3c, 66-4c, and 66-5c may be, for example, 100° C. to 200° C.

The pipe heaters 66-3d, 66-4d, and 66-5d suppress the gas heated by the heaters 66-3c, 66-4c, and 66-5c from decreasing in temperature when flowing through the gas pipes 66-3b, 66-4b, and 66-5b. The set temperature of the pipe heaters 66-3d, 66-4d, and 66-5d may be the same as, for example, the set temperature of the heaters 66-3c, 66-4c, and 66-5c and may be, for example, 100° C. to 200° C.

(Film Deposition Method)

As an example of a film deposition method using the heat treatment apparatus 1C, a method of forming a silicon nitride film on a wafer W by the ALD method will be described.

First, the wafer boat 16 holding a plurality of wafers W is carried into the processing container 10 by the elevating unit 46, and the opening at the lower end of the processing container 10 is hermetically closed by the lid 38 and hermetically sealed. Subsequently, the exhaust unit 74 performs an evacuation so that the pressure in the processing chamber 10 becomes a predetermined pressure, and the wafer W in the processing chamber 10 is heated by the heater 90 to rotate the wafer boat 16.

Subsequently, a silicon-containing gas from the gas supply pipe 62, an inert gas from the gas supply pipes 66-3, 66-4, and 66-5, a nitriding gas from the gas supply pipe 64, and an inert gas from the gas supply pipes 66-3, 66-4, and 66-5 are intermittently supplied in this order. Thus, the silicon-containing gas is first adsorbed on the wafer W in the step of supplying the silicon-containing gas, and the surplus silicon-containing gas is purged in the next step of supplying the inert gas. Then, the nitriding gas supplied in the next step of supplying the nitriding gas is reacted with the silicon-containing gas, and the surplus nitriding gas is purged in the next step of supplying the inert gas, thereby forming a thin unit film which is a substantially monomolecular layer. This series of cycles is performed a predetermined number of times to form a silicon nitride film having a desired film thickness.

As described above, in the ALD method, the silicon-containing gas and the nitriding gas are alternately supplied into the processing container 10 with the purge gas interposed therebetween in a short time. Therefore, in order to supply a predetermined amount of gas within a predetermined time, it is preferable that a large flow rate (e.g., 10 slm or more) of gas may be supplied from the gas supply pipes 62, 64, 66-3, 66-4, and 66-5.

However, in the heat treatment apparatus 1C, since each gas is discharged in the horizontal direction from the plurality of gas holes 62a, 64a, 66-3a, and 66-4a, the gas is supplied to the wafer W from the peripheral side, and the gas flows on the wafer W from the peripheral portion to the central portion. Therefore, when supplying a large flow rate of gas into the processing container 10, and when the gas discharged from the gas holes 62a, 64a, 66-3a, 66-4a, and 66-5a is not sufficiently heated, the temperature of the peripheral portion of the wafer W decreases due to the gas. As a result, a temperature difference occurs between the central portion and the peripheral portion of the wafer W, and the in-plane uniformity of the wafer temperature deteriorates.

Further, in the heat treatment apparatus 1C, the gas flows upward from below in the gas supply pipes 62, 64, 66-3, 66-4, and 66-5 provided in the inner pipe 12 along the longitudinal direction. At this time, when the gas supplied to the gas supply pipes 62, 64, 66-3, 66-4, and 66-5 is not sufficiently heated, the gas is heated by the heater 90 when flowing through the gas supply pipes 62, 64, 66-3, 66-4, and 66-5. Then, the temperature of the gas supplied to a lower zone in the processing container 10 becomes lower than the temperature of the gas supplied to an upper zone in the processing container 10. As a result, the inter-plane uniformity of the wafer temperature deteriorates. Also, the temperature difference increases as the flow rate of the gas supplied from the gas supply pipes 62, 64, 66-3, 66-4, and 66-5 into the processing container 10 increases.

Therefore, in the third embodiment, when supplying a large flow rate of gas into the processing container 10, the gas is heated to a predetermined temperature by the heaters 62c, 64c, 66-3c, 66-4c, and 66-5c and the pipe heaters 62d, 64d, 66-3d, 66-4d, and 66-5d. Thus, even when a large flow rate of gas is supplied into the processing container 10, since a sufficiently heated gas is supplied into the processing container 10, it is possible to suppress the decrease in temperature of the peripheral portion of the wafer W. As a result, the in-plane uniformity of the wafer temperature is improved. Further, since the temperature difference between the gas supplied to the lower zone and the gas supplied to the upper zone in the processing container 10 is reduced, the inter-plane uniformity of the wafer temperature is improved.

In particular, in the third embodiment, the purge gas, which is often supplied at a large flow rate, is simultaneously supplied into the processing container 10 through three gas supply pipes 66-3, 66-4, and 66-5 having different lengths. Therefore, the purge gas is more likely to be heated as compared with a case where the same flow rate of the purge gas is supplied from one gas supply pipe 66. As a result, the in-plane uniformity and the inter-plane uniformity of the wafer temperature are further improved.

Further, in the third embodiment, the heaters 66-3c, 66-4c, and 66-5c are provided in three gas supply pipes 66-3, 66-4, and 66-5 having different lengths, respectively. Thus, by controlling the set temperature of the heaters 66-3c, 66-4c, and 66-5c, the temperature of the gas supplied to each of the gas supply pipes 66-3, 66-4, and 66-5 may be adjusted. For example, the temperature of the purge gas supplied to the gas supply pipe 66-5 at the lowermost position is adjusted to be higher than the temperature of the gas supplied to the gas supply pipe 66-4 at the central position. Thus, the temperature of the gas supplied to the lower portion of the inner tube 12 that is not easily heated in the processing container 10 may be set to be higher in advance than the temperature of the gas supplied to the central portion of the inner tube 12. Further, for example, the temperature of the purge gas supplied to the gas supply pipe 66-4 at the central position is adjusted to be higher than the temperature of the gas supplied to the gas supply pipe 66-3 at the uppermost position. Thus, the temperature of the gas supplied to the lower portion of the inner tube 12 that is not easily heated in the processing container 10 may be set to be higher in advance than the temperature of the gas supplied to the upper portion of the inner tube 12. As a result, the temperature difference in the purge gas supplied to each of the upper portion, the central portion, and the lower portion of the inner tube 12 is reduced, and the inter-plane uniformity of the wafer temperature is improved.

Further, in the ALD method, in order to purge the first reaction gas and the second reaction gas remaining in the processing container 10 in a short time, in many cases, the purge gas is supplied at a larger flow rate than the first reaction gas or the second reaction gas. Therefore, the purge gas may be heated by the heaters 66-3c, 66-4c, and 66-5c and the pipe heaters 66-3d, 66-4d, and 66-5d, and the first reaction gas and the second reaction gas may be heated only by the pipe heaters 62d and 64d. Further, when a distance between the gas supply pipes 62, 64, 66-3, 66-4, and 66-5 and the heaters 62c, 64c, 66-3c, 66-4c, and 66-5c is short, the pipe heaters 62d, 64d, 66-3d, 66-4d, and 66-5d may not be provided.

In the above embodiment, the ALD method has been described as an example of the film deposition method. However, the present disclosure is not limited to this, and may be similarly applied to, for example, a CVD method.

Further, in the above embodiment, descriptions have been made on a case where the purge gas is supplied through two gas supply pipes 66-3 and 66-4 having different lengths. However, the present disclosure is not limited to this, and a purge gas may be supplied through, for example, two gas supply pipes having different lengths or four or more gas supply pipes having different lengths. In addition, the first reaction gas and the second reaction gas may be supplied through a plurality of gas supply pipes having different lengths.

Further, in the above embodiment, the heater 90 is an example of a first heater, and the heaters 62c, 64c, 66c, 66-1c, 66-2c, 66-3c, 66-4c, and 66-5c are examples of a second heater.

In the above embodiment, descriptions have been made on a case where the substrate is a semiconductor wafer as an example, but the present disclosure is not limited to this. The substrate may be, for example, a large substrate for a flat panel display (FPD), or a substrate for an EL element or a solar cell.

According to the present disclosure, temperature uniformity in a large flow rate process may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
a processing container configured to accommodate and process a plurality of substrates in multiple tiers under a reduced-pressure environment;
a first heater configured to heat the plurality of substrates accommodated in the processing container;
a plurality of gas supply pipes provided at different heights in the processing container and each configured to supply a gas to a corresponding position thereof; and
a second heater provided on a gas supply pipe that supplies a gas to a lowermost position among the plurality of gas supply pipes, and configured to heat the gas in the gas supply pipe.

2. The heat treatment apparatus according to claim 1, wherein the second heater is provided in two or more of the plurality of gas supply pipes.

3. The heat treatment apparatus according to claim 2, wherein the plurality of gas supply pipes are configured to supply a same gas.

4. The heat treatment apparatus according to claim 3, wherein the gas is a purge gas.

5. The heat treatment apparatus according to claim 1, wherein the plurality of gas supply pipes are configured to supply a same gas.

6. The heat treatment apparatus according to claim 1, wherein the gas is a purge gas.

7. The heat treatment apparatus according to claim 1, wherein the plurality of gas supply pipes independently discharge the gas to an upper portion, a central portion, and a lower portion in the processing container.

8. The heat treatment apparatus according to claim 1, wherein each of the plurality of gas supply pipes includes gas holes each located between adjacent substrates.

9. A film deposition method comprising:
alternately supplying a first reaction gas and a second reaction gas from a plurality of gas supply pipes into a processing container that accommodates a substrate with a purge gas interposed therebetween, thereby depositing reaction products of the first reaction gas and the second reaction gas on the substrate, the plurality of gas supply pipes being provided at different heights in the processing container and each configured to supply at least one of the first reaction gas, the second reaction gas, and the purge gas to a corresponding position thereof,
wherein the at least one of the first reaction gas, the second reaction gas, and the purge gas is supplied into the processing container while being heated.

10. The film deposition method according to claim 9, wherein the gas is supplied into the processing container from the plurality of gas supply pipes at a same time.

11. The film deposition method according to claim 9, wherein a plurality of substrates is accommodated in multiple tiers in the processing container.

12. The film deposition method according to claim 11, wherein a temperature of the gas supplied from one of the plurality of gas supply pipes is higher than a temperature of the gas supplied from another gas supply pipe that supplies the gas to a position above the one of the plurality of gas supply pipes.

13. The film deposition method according to claim 12, wherein the at least one of the first reaction gas, the second reaction gas, and the purge gas is the purge gas.

14. The film deposition method according to claim 12, wherein the second reaction gas is a nitriding gas or an oxidizing gas, and
the at least one of the first reaction gas, the second reaction gas, and the purge gas is the second reaction gas.

15. The film deposition method according to claim 9, wherein the at least one of the first reaction gas, the second reaction gas, and the purge gas is the purge gas.

16. The film deposition method according to claim 9, wherein the second reaction gas is a nitriding gas or an oxidizing gas, and
the at least one of the first reaction gas, the second reaction gas, and the purge gas is the second reaction gas.

* * * * *